(12) United States Patent
Kang et al.

(10) Patent No.: US 8,421,084 B2
(45) Date of Patent: Apr. 16, 2013

(54) ORGANIC LIGHT EMITTING DISPLAY AND MANUFACTURING METHOD THEREOF

(75) Inventors: Jae-Wook Kang, Yongin (KR); Jin-Seong Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 51 days.

(21) Appl. No.: 12/926,636

(22) Filed: Dec. 1, 2010

(65) Prior Publication Data

US 2011/0147769 A1  Jun. 23, 2011

(30) Foreign Application Priority Data

Dec. 23, 2009 (KR) .................. 10-2009-0130020

(51) Int. Cl.
| | |
|---|---|
| H01L 27/14 | (2006.01) |
| H01L 29/04 | (2006.01) |
| H01L 29/12 | (2006.01) |
| H01L 21/00 | (2006.01) |
| H01L 21/84 | (2006.01) |

(52) U.S. Cl.
USPC .................. 257/72; 257/99; 257/40; 257/43; 257/79; 438/149; 438/99; 438/48; 438/151

(58) Field of Classification Search ............ 257/72, 257/88, 99, 40, 43, 59, 391, 642, 643, 759, 257/57, 347, 350, 351, 79; 438/82, 99, 149, 438/48, 128, 151, 157, 283, 22
See application file for complete search history.

(56) References Cited

U.S. PATENT DOCUMENTS

| | | | |
|---|---|---|---|
| 2008/0142800 A1* | 6/2008 | Arai et al. | 257/59 |
| 2008/0197350 A1 | 8/2008 | Park et al. | |
| 2009/0045401 A1* | 2/2009 | Yamazaki et al. | 257/57 |
| 2010/0051936 A1 | 3/2010 | Hayashi et al. | |
| 2010/0308324 A1* | 12/2010 | Kim et al. | 257/43 |

FOREIGN PATENT DOCUMENTS

| | | |
|---|---|---|
| JP | 2002-134178 A | 5/2002 |
| JP | 2008-166716 A | 7/2008 |
| KR | 10-2006-0001753 A | 1/2006 |
| KR | 10-2007-0075920 A | 7/2007 |
| KR | 10 2008-0029230 A | 4/2008 |
| KR | 10 2008-0076608 A | 8/2008 |
| KR | 10-2009-0105560 A | 10/2009 |

* cited by examiner

Primary Examiner — Chuong A. Luu
(74) Attorney, Agent, or Firm — Lee & Morse, P.C.

(57) ABSTRACT

An organic light emitting display includes a gate electrode on a substrate, an active layer insulated from the gate electrode, source and drain electrodes that are insulated from the gate electrode and contact the active layer, an insulating layer between the active layer and the source and drain electrodes, a light blocking layer that is on the active layer and that blocks light of a predetermined wavelength from the active layer, and an organic light emitting device that is electrically connected to one of the source and drain electrodes.

17 Claims, 5 Drawing Sheets

ORGANIC LIGHT EMITTING DISPLAY AND MANUFACTURING METHOD THEREOF

BACKGROUND

1. Field

Embodiments relate to an organic light emitting display and a manufacturing method thereof.

2. Description of the Related Art

An active matrix type organic light-emitting display may include, in each pixel, a thin-film transistor (TFT) and an organic light emitting diode (OLED) connected to the TFT.

An active layer of the TFT may be formed of amorphous silicon or polysilicon. Recently, attempts have been made to form the active layer of the TFT using an oxide semiconductor.

SUMMARY

It is a feature of an embodiment to provide an organic light emitting display including a thin film transistor (TFT) in which penetration of light, water, and/or oxygen may be prevented, and a method of manufacturing the organic light emitting display.

It is another feature of an embodiment to provide an organic light emitting display that may be easily applied to large-sized display devices and enables mass production thereof, and a method of manufacturing the organic light emitting display.

At least one of the above and other features and advantages may be realized by providing an organic light emitting display, including a gate electrode on a substrate, an active layer insulated from the gate electrode, source and drain electrodes that are insulated from the gate electrode and contact the active layer, an insulating layer between the active layer and the source and drain electrodes, a light blocking layer that is on the active layer and that blocks light of a predetermined wavelength from the active layer, and an organic light emitting device that is electrically connected to one of the source and drain electrodes.

The light blocking layer may block blue light.

The light blocking layer may include at least one of manganese-doped barium titanate, titanium nitride, and electrochromic nickel oxide.

The light blocking layer may be on the insulating layer.

The light blocking layer may be directly on the insulating layer.

The organic light emitting display may further include a passivation layer covering the gate insulating layer, the source and drain electrodes, and the insulating layer. The light blocking layer may be on the passivation layer.

The light blocking layer may be disposed on a path of light that is emitted from the organic light emitting device, which path of light is incident to the active layer.

At least a portion of light emitted from the organic light device may be reflected by the light blocking layer.

The active layer may include an oxide semiconductor.

Light emitted from the organic light emitting device may be emitted toward the substrate.

At least one of the above and other features and advantages may also be realized by providing a method of manufacturing an organic light emitting display, the method including forming a gate electrode on a substrate, forming an active layer insulated from the gate electrode, forming source and drain electrodes that are insulated from the gate electrode and contact the active layer, forming an insulating layer, the insulating layer being between the active layer and the source and drain electrodes, forming a light blocking layer on the active layer, the light blocking layer covering at least a channel area of the active layer, and forming an organic light emitting device that is electrically connected to the source and drain electrodes.

The method may further include forming a gate insulating layer on the substrate to cover the gate electrode, forming the active layer on the gate insulating layer, forming the insulating layer covering at least a channel area of the active layer, and forming the light blocking layer on the insulating layer so as to cover at least the channel area of the active layer.

The method may further include forming a gate insulating layer on the substrate to cover the gate electrode, forming the active layer on the gate insulating layer, forming the insulating layer covering at least a channel area of the active layer, forming the source and drain electrodes on the insulating layer to contact the active layer, forming a passivation layer to cover the gate insulating layer, the source and drain electrodes, and the insulating layer, and forming the light blocking layer on the passivation layer so as to cover at least the channel area of the active layer.

The light blocking layer may block blue light.

The light blocking layer may include at least one of manganese-doped barium titanate, titanium nitride, or electrochromic nickel oxide.

The light blocking layer may be disposed on a path of light that is emitted from the organic light emitting device, which path of light is incident to the channel area.

At least a portion of light emitted from the organic light device may be reflected by the light blocking layer.

Light emitted from the organic light emitting device may be emitted toward the substrate.

The active layer may include an oxide semiconductor.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
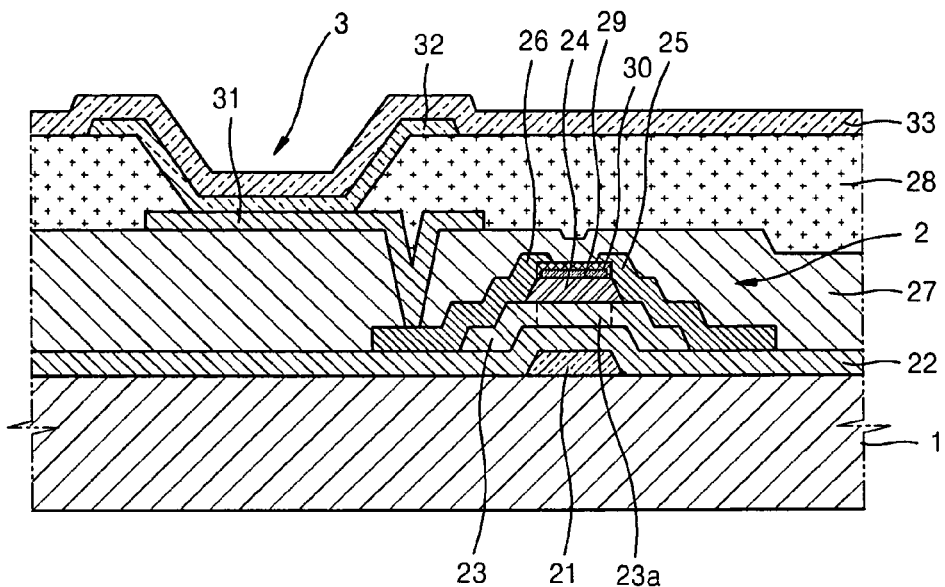
FIG. 1 illustrates a cross-sectional view of an organic light-emitting display according to a first embodiment.

Korean Patent Application No. 10-2009-0130020, filed on Dec. 23, 2009, in the Korean Intellectual Property Office, and entitled: "Organic Light Emitting Display and Manufacturing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Embodiments relate to an organic light-emitting display and a manufacturing method thereof. The organic light-emitting display may include one or more thin-film transistors (TFTs) in pixels thereof.

FIG. 1 illustrates a cross-sectional view of an organic light-emitting display according to a first embodiment.

In FIG. 1, for convenience of explanation, a portion of one pixel of the organic light-emitting display is illustrated. It will be understood that the organic light-emitting display may include a plurality of such pixels.

Referring to FIG. 1, a thin-film transistor (TFT) 2 and an organic light-emitting device 3 may be disposed on a substrate 1. In FIG. 1, the TFT 2 is a illustrated as bottom gate type (or gate first) TFT. It will be understood, however, that the embodiments may also be applied to a top gate type TFT, in which the active layer is disposed under the gate. The organic light emitting display may be a top emission type display, where the display is viewed from opposite the substrate 1, or a bottom emission type display, where the display is viewed from the side of the substrate 1 (bottom side in FIG. 1).

The substrate 1 may be formed of a transparent material, e.g., in the case of a bottom emission type display. A buffer layer (not shown) formed of, e.g., an material such as a silicon oxide, may be further formed on the substrate 1.

Where the TFT 2 is a bottom gate type, the TFT 2 may include a gate electrode 21 formed on the substrate 1, a gate insulating layer 22 covering the gate electrode 21, and an active layer 23 formed on the gate insulating layer 22. An insulating layer 24 may be formed on the gate insulating layer 22 to cover the active layer 23, and a source electrode 25 and a drain electrode 26 may be formed on the insulating layer 24. The source electrode 25 and the drain electrode 26 may respectively contact source and drain areas of the active layer 23.

As described in detail herein, a light blocking layer 29 may be formed to reduce or eliminate the irradiation of light on the active layer 23. In the embodiment illustrated in FIG. 1, the light blocking layer 29 may be formed on the insulating layer 24 to cover at least a portion of the active layer 23, e.g., a channel area 23a and portions of the source/drain areas adjacent thereto. In an implementation, the light blocking layer 29 may be formed directly on the insulating layer 24. The light blocking layer 29 may be relatively small, economical, and easy to form as compared to a layer applied to coat an entire surface of the substrate 1, features which become more advantages as a size of the substrate, i.e., a size of the display, increases.

The gate electrode 21 may be formed of, e.g., a conductive metal. The gate electrode 21 may be formed as a single layer or a multilayer. The gate electrode 21 may include molybdenum.

The gate insulating layer 22 may be formed of an insulating material, e.g., silicon oxide, tantalum oxide, aluminum oxide, etc.

The active layer 23 may be patterned on the gate insulating layer 22. The active layer 23 may be formed of, e.g., an oxide semiconductor. For example, the oxide semiconductor active layer 23 may include a semiconductor material including oxygen (O) and at least one of gallium (Ga), phosphor (I), hafnium (Hf), zinc (Zn), and tin (Sn), such as ZnO, ZnGaO, ZnInO, GaInO, GaSnO, ZnSnO, InSnO, HfInZnO, or ZnGaInO. In an implementation, the oxide semiconductor active layer 23 may be a H-I-Z-O layer or a layer of a(In$_2$O$_3$) b(Ga$_2$O$_3$)c(ZnO) (G-I-Z-O layer), where a, b, and c are real numbers that satisfy a≧0, b≧0, and c≧0, respectively.

The insulating layer 24 may be formed to cover the active layer 23. The insulating layer 24 may protect the channel area 23a of the active layer 23. In an implementation, the insulating layer 24 may be formed only on the channel area 23a. In another implementation, the insulating layer 24 may completely cover the active layer 23 except portions of the active layer 23 contacting the source and drain electrodes 25 and 26.

The light blocking layer 29 may be formed to cover the insulating layer 24. The light blocking layer 29 may protect the channel area 23a of the active layer 23 against exposure to light. In an implementation, the light blocking layer 29 may block or be selective to blue light, e.g., light having a wavelength of about 450 nm. In an implementation, the light blocking layer may be formed only on the channel area 23a. In another implementation (not shown), the light blocking layer 29 may cover the active layer 23 except a portion thereof contacting the source and drain electrodes 25 and 26. The light blocking layer 29 will be described in further detail below.

The source electrode 25 and the drain electrode 26 may be formed on the light blocking layer 29 so as to contact the active layer 23. A passivation layer 27 may be formed on the light blocking layer 29 to cover the source electrode 25 and the drain electrode 26. A first electrode 31 of the organic light emitting device 3, contacting the drain electrode 26, may be formed on the passivation layer 27. The first electrode 31 is formed in each pixel by, e.g., patterning.

A pixel defining layer (PDL) 28 that exposes a portion of the first electrode 31 may be formed on the passivation layer 27. An organic layer 32 may be formed on the portion of the first electrode 31 that is exposed by the PDL 28. A second electrode 33 may be formed on the organic layer 32.

The PDL 28 may be formed to cover ends of the first electrode 31. In addition to defining a light emitting area, the PDL 28 may widen a distance between ends of the first electrode 31 and the second electrode 33, thereby preventing concentration of an electric field on the ends of the first electrode. Thus a short circuit between the first electrode 31 and the second electrode 33 may be prevented.

In a top emission type organic light emitting display, in which an image is formed toward the second electrode 33, the first electrode 31 may be a reflective electrode. In this case, a reflective layer formed of an alloy of Al, Ag, etc., may be used for the first electrode 31.

When the first electrode 31 is used as an anode electrode, the first electrode 31 may include a layer formed of a metal oxide, such as ITO, IZO, or ZnO, which has a high work function (absolute value). When the first electrode 31 is used as a cathode electrode, the first electrode 31 may include a highly conductive metal having a low work function (absolute value), such as Ag, Mg, Al, Pt, Pd, Au, Ni, Nd, Ir, Cr, Li, or Ca. In this case, a separate reflective layer may be omitted.

In a top emission type organic light emitting display, the second electrode 33 may be a light-transmissive electrode. In this case, the second electrode 33 may include a semi-transmissive reflective layer comprising a thin film formed of Ag, Mg, Al, Pt, Pd, Au, Ni, Nd, Ir, Cr, Li, or Ca, or a light-transmissive metal oxide such as ITO, IZO, or ZnO. When the first electrode 31 is used as an anode, the second electrode 33 is used as a cathode, and when the first electrode 31 is used as a cathode, the second electrode 33 is used as an anode.

The organic layer 32 interposed between the first electrode 31 and the second electrode 33 may be, or may include, an emission layer. In an implementation, the organic layer 32 may be formed of a stack structure in which a hole injection layer, an emission layer, an electron injection and transporting layer, etc., are stacked.

Although not shown in FIG. 1, a protection layer may be further formed on the second electrode 33, and the pixel may be encapsulated using, e.g., glass on the top thereof.

The light blocking layer 29 of the organic light emitting display of FIG. 1 will now be described in further detail.

When the active layer 23 is formed using an oxide semiconductor, it is preferable that light, oxygen, and water be blocked. Among these, oxygen and water may be blocked to some extent by using the first electrode 31 and the second electrode 33, or using an encapsulation process when manufacturing the organic light-emitting display. Of the light incident to the TFT 2, external light may be blocked by using, e.g., UV coating, a black matrix, etc. However, light emitted from within the display itself, e.g., light such as blue light having a wavelength of about 450 nm emitted the organic layer 32 of the organic light-emitting device 3, may adversely affect the TFT 2.

Figure 3:
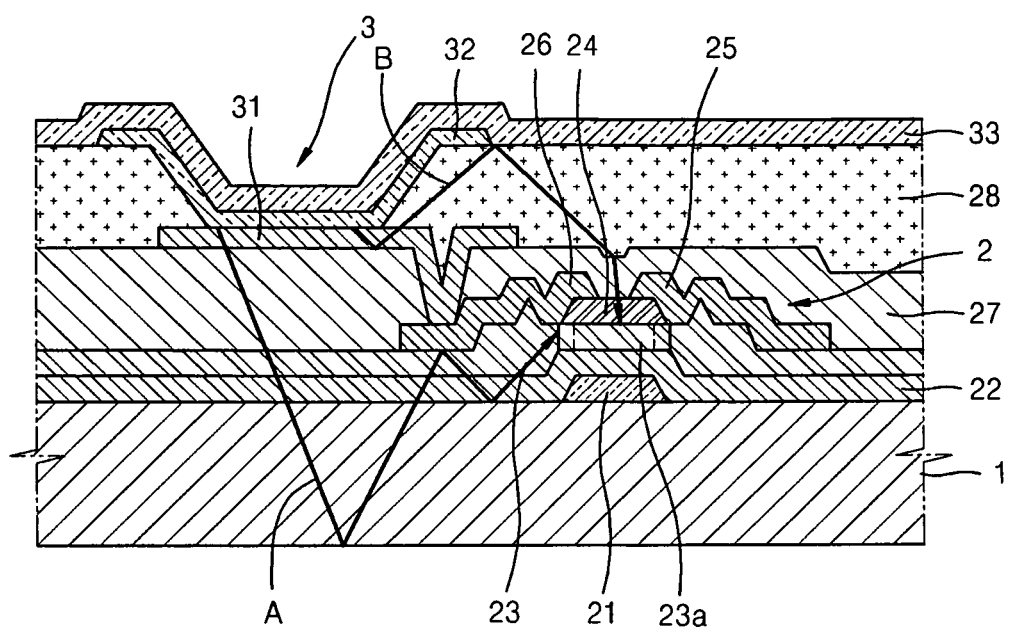
FIG. 3 illustrates a light path diagram for explaining features of the first and second embodiments.

FIG. 3 illustrates a light path diagram for explaining features of the first and second embodiments. Referring to FIG. 3, there are two paths through which light emitted from the organic layer 32 may be incident to the TFT 2. The first path is a path that is denoted with a letter A in FIG. 3 and through which light emitted from the organic layer 32 is irradiated to the active layer 23 through between the source and drain electrodes 25 and 26 and the gate electrode 21. Where a distance between the source and drain electrodes 25 and 26 and the gate electrode 21 is only about 350 nm, i.e., wavelength of blue light (about 450 nm), there is relatively low possibility that light is irradiated to the TFT 2. The second path is a path denoted with a letter B in FIG. 3 and through which light emitted from the organic layer 32 is irradiated to the active layer 23 through the PDL 28 and the passivation layer 27. In this second case, the light passes between the source and drain electrodes 25, 26. Also, a distance between the source and drain electrodes 25 and 26 and the second electrode 33 may be about 1800 nm or more, such that the light emitted from the organic layer 32 is highly likely to be guided to the active layer 23.

In the organic light-emitting display according to the first embodiment, the insulating layer 24 and the light blocking layer 29 may be formed on the active layer 23. Thus, in the organic light-emitting display according to the first embodiment, the light emitted from the organic layer 32 may be blocked or filtered from being directly incident to the active layer 23.

The light blocking layer 29 is formed on a light path of light that is incident to the TFT 2 from the organic layer 32. The light blocking layer 29 may be formed of a material that is capable of blocking blue light. For example, manganese (Mn)-doped barium titanate ($BaTiO_3$), titanium nitride (TiN), or electrochromic nickel oxide (NiO) may be used as the light blocking layer 29. These materials are mostly brown-colored and may block blue light. An insulating layer 30 covering the light blocking layer 29, and interposed between the light blocking layer 29 and the source/drain electrodes 25, 26, may serve to prevent electrical contact therebetween.

As described above in connection with the first embodiment, the organic light-emitting display may be constructed such that blue light may be prevented from directly being incident to the active layer 23, which may increase the stability of an oxide semiconductor layer, reduce product defects, and increase user convenience.

Figure 2:
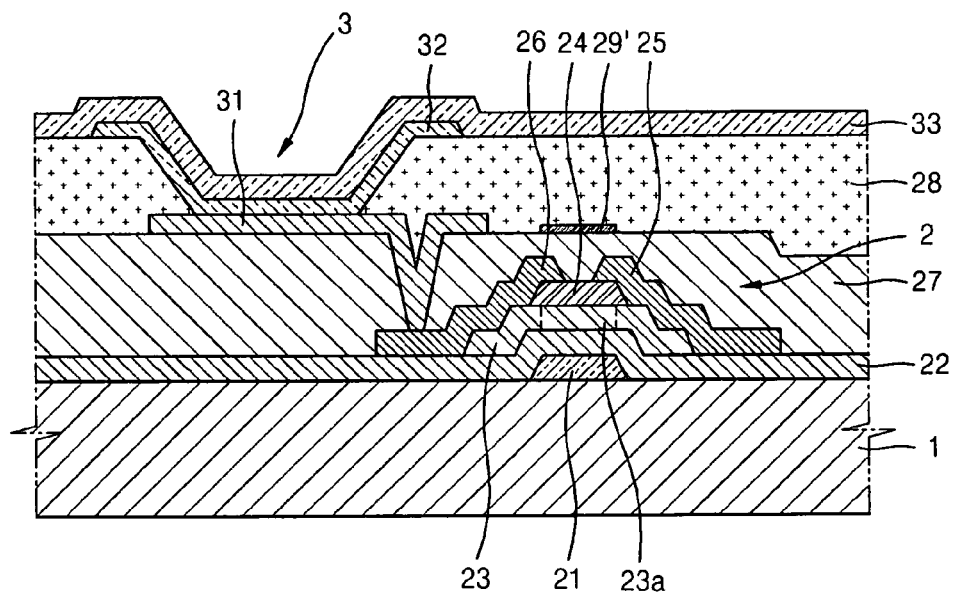
FIG. 2 illustrates a cross-sectional view of an organic light-emitting display according to a second embodiment.

FIG. 2 illustrates a cross-sectional view of an organic light-emitting display according to a second embodiment.

Referring to FIG. 2, a light blocking layer 29' may be formed on the passivation layer 27. For example, the source electrode 25, the drain electrode 26, and the passivation layer 27 may be sequentially formed on the insulating layer 24, and the light blocking layer 29' may be formed on a portion of the passivation layer 27 corresponding to the active layer 23. The light blocking layer 29' is sized and positioned to intercept a path of light that is incident to the TFT 2 from the organic layer 32. Accordingly, the reliability of the organic light emitting display device may be increased.

FIGS. 4A through 4E illustrate cross-sectional views of stages in a method of manufacturing the organic light emitting display including the light blocking layer 29 shown in FIG. 1.

Figure 4A:
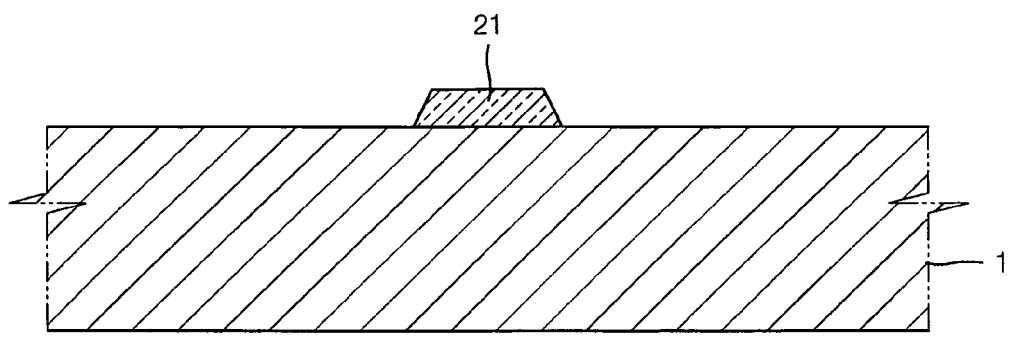
FIGS. 4A through 4E illustrate cross-sectional views of stages in a method of manufacturing the organic light emitting display of FIG. 1.

Referring to FIG. 4A, first, a substrate 1 may be provided. The substrate 1 may be formed of silicon (Si), glass, or organic materials. Where the organic light emitting display device is a bottom emission type display, the substrate 1 may be transparent. When using a Si substrate, an insulating layer, e.g., silicon oxide (not shown) may be formed on a surface of the Si substrate using, e.g., a thermal oxidizing process. Next, the substrate 1 may be coated with a conductive material such as a metal or a conductive oxide and then patterned to form the gate electrode 21.

Figure 4B:
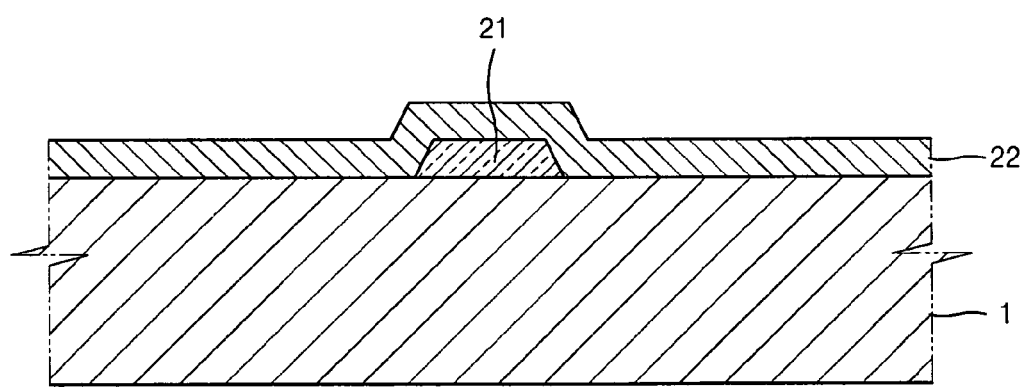

Next, referring to FIG. 4B, an insulating material may be coated on the gate electrode 21 and patterned to form the gate insulating layer 22.

Figure 4C:
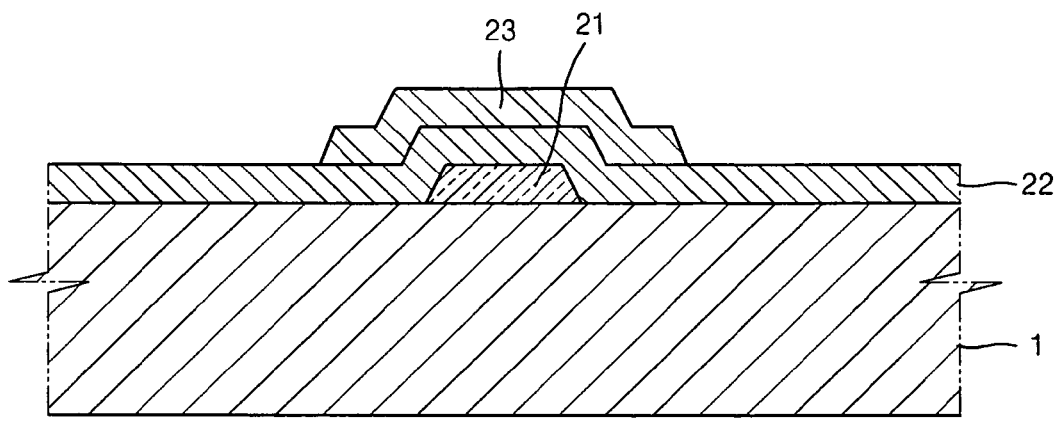

Next, referring to FIG. 4C, a semiconductor material, e.g., and oxide semiconductor material, may be deposited on a portion of the gate insulating layer 22 corresponding to the gate electrode 21. The semiconductor material may be deposited using, e.g., a physical vapor deposition method (PVD), a chemical vapor deposition (CVD) method, or an atomic layer deposition (ALD) method. The semiconductor material may be patterned to form an active layer 23. Examples of the semiconductor material include a layer of $a(In_2O_3)b(Ga_2O_3)c(ZnO)$ (G-I-Z-O layer), where a, b, and c are real numbers that satisfy $a \geq 0$, $b \geq 0$, and $c \geq 0$, respectively, and a hafnium-indium-zinc oxide (H-I-Z-O) layer.

Figure 4D:
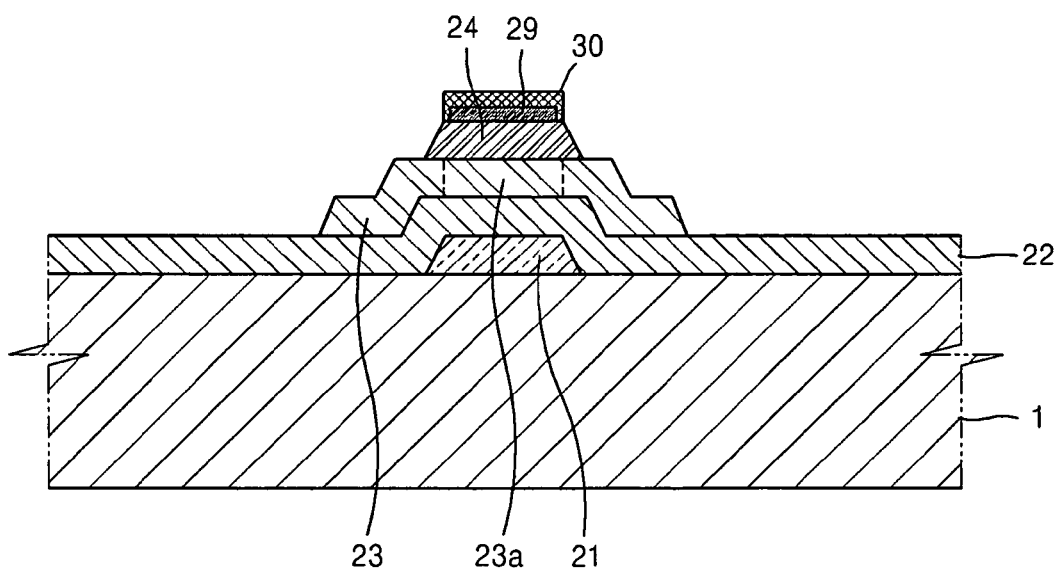

Next, referring to FIG. 4D, an insulating material may be coated on the active layer 23 to cover a channel layer 23a of the active layer 23. The insulating material may be patterned to form the insulating layer 24. Then, a light blocking material (for the light blocking layer 29) may be coated on the insulating layer 24 to cover the patterned insulating layer 24. In another implementation, the insulating material may be coated on the active layer to cover the channel layer 23a of the active layer 23, the light blocking material may be coated on the insulating material, and the light blocking material may be patterned at the same time as the underlying insulating material to form the insulating layer 24 and the light blocking layer 29. The light blocking material may be deposited by any suitable deposition method, including spin coating, sputtering, chemical vapor deposition, e-beam, etc.

The light blocking layer 29 may be formed of a material capable of blocking blue light. For example, a Mn-doped barium titanate ($BaTiO_3$), titanium nitride (TiN), or an electrochromic nickel oxide (NiO) may be used as the light blocking layer 29. These materials are mostly brown-colored and can block blue light. The light blocking layer 29 is formed on a path of light that is incident to the TFT 2 from the organic layer 32.

The insulating layer 30 may then be formed so as to be interposed between the light blocking layer 29 and the source/drain electrodes 25, 26 (described below) to serve to prevent electrical contact therebetween. In an implementation, the insulating material may be coated on the light blocking layer 29 so as to cover exposed surfaces thereof, e.g., the top and side surfaces, to thereby electrically insulate the light blocking layer from the source/drain electrodes 25, 26. In an implementation, the insulating material may be coated on the active layer to cover the channel layer 23a of the active layer 23, the light blocking material may be coated on the insulating material, and the light blocking material may be patterned at the same time as the underlying insulating material to form the insulating layer 24 and the light blocking layer 29, after which the insulating layer 30 may be formed to cover the light blocking layer 29.

Figure 4E:
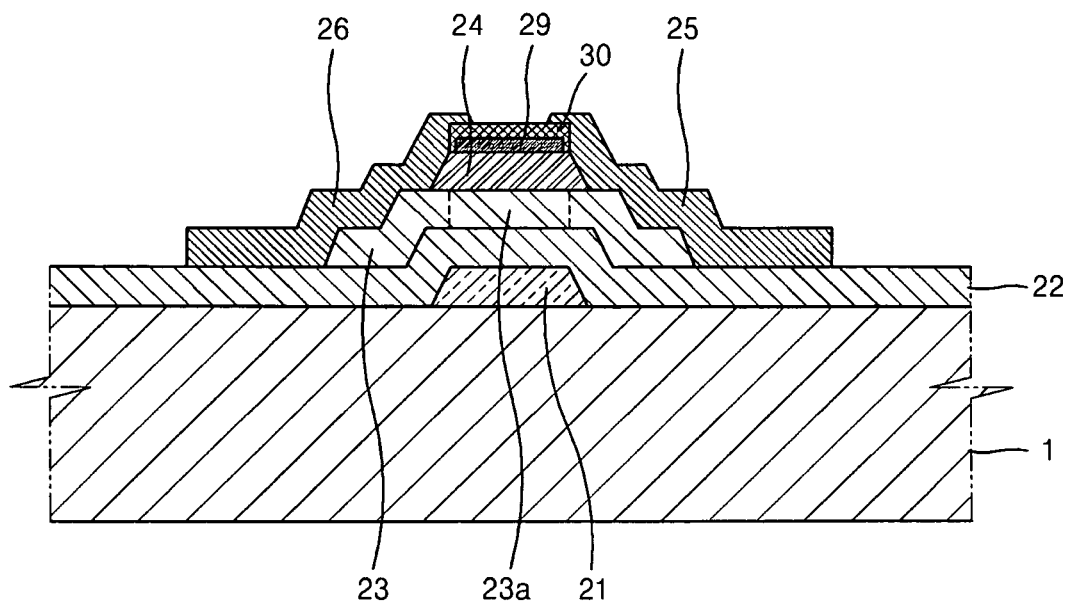

Next, referring to FIG. 4E, a metal or a conductive metal oxide (for the source and drain electrodes 25, 26) may be coated on the gate insulating layer 22, the active layer 23, and the light blocking layer 29. The metal or conductive metal oxide may be patterned to form the source electrode 25 and the drain electrode 26.

Subsequently, the passivation layer 27 may be formed to cover the source electrode 25 and the drain electrode 26. A contact hole may be formed in the passivation layer 27, and a first electrode of the organic light emitting device 3 which contacts the drain electrode 26 may be formed through the contact hole. Next, a PDL 28 that exposes a portion of the first electrode 31 may be formed on the passivation layer 27, and the organic layer 32 and the second electrode 33 may be formed on the portion of the first electrode 31 exposed by the PDL 28, thereby completing the structure illustrated in FIG. 1.

As described above, an organic light emitting display according to embodiments prevents light, e.g., blue light, from being directly incident to the TFT 2, which may increase the stability of an oxide semiconductor in the TFT 2, reduce product defects, and increase user convenience.

Characteristics of an oxide semiconductor, such as a threshold voltage, an S-factor, etc., may vary due to the penetration of water, oxygen, or light. Also, the variation in the threshold voltage due to the water, oxygen, or light may be further increased by a DC bias of a gate electrode during driving of the TFT, and thus the DC stability is a great problem in regard to use of the oxide semiconductor. In order to improve the barrier characteristics of the oxide semiconductor against water or oxygen, an aluminum oxide ($AlO_x$) layer or a titanium nitride (TiN) layer may be used. However, forming these layers using a reactive sputtering method or an atomic layer deposition (ALD) method may be difficult when applied to a large-sized substrate, such that a mass production rate of the layers may be low. In contrast, an organic light emitting display as described above in connection with the first and second embodiments may prevent light, e.g., blue light, from being directly incident to the TFT 2 using the light blocking layer 29.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display, comprising:
a gate electrode on a substrate;
an active layer insulated from the gate electrode;
source and drain electrodes that are insulated from the gate electrode and contact the active layer;
an insulating layer between the active layer and the source and drain electrodes;
a light blocking layer that is on the active layer, the light blocking layer including at least one of manganese-doped barium titanate, titanium nitride, and electrochromic nickel oxide; and
an organic light emitting device that is electrically connected to one of the source and drain electrodes.

2. The organic light emitting display as claimed in claim 1, wherein the light blocking layer blocks blue light.

3. The organic light emitting display as claimed in claim 1, wherein the light blocking layer is on the insulating layer.

4. The organic light emitting display as claimed in claim 3, wherein the light blocking layer is directly on the insulating layer.

5. The organic light emitting display as claimed in claim 3, further comprising a passivation layer covering the gate insulating layer, the source and drain electrodes, and the insulating layer,
wherein the light blocking layer is on the passivation layer.

6. The organic light emitting display as claimed in claim 1, wherein the light blocking layer is disposed on a path of light that is emitted from the organic light emitting device, which path of light is incident to the active layer.

7. The organic light emitting display as claimed in claim 1, wherein at least a portion of light emitted from the organic light device is reflected by the light blocking layer.

8. The organic light emitting display as claimed in claim 1, wherein the active layer includes an oxide semiconductor.

9. The organic light emitting display as claimed in claim 1, wherein light emitted from the organic light emitting device is emitted toward the substrate.

10. A method of manufacturing an organic light emitting display, the method comprising:
forming a gate electrode on a substrate;
forming an active layer insulated from the gate electrode;
forming source and drain electrodes that are insulated from the gate electrode and contact the active layer;
forming an insulating layer, the insulating layer being between the active layer and the source and drain electrodes;
forming a light blocking layer on the active layer, the light blocking layer covering at least a channel area of the active layer, the light blocking layer including at least one of manganese-doped barium titanate, titanium nitride, and electrochromic nickel oxide; and
forming an organic light emitting device that is electrically connected to the source and drain electrodes.

11. The method as claimed in claim 10, further comprising:
forming a gate insulating layer on the substrate to cover the gate electrode;
forming the active layer on the gate insulating layer;
forming the insulating layer covering at least a channel area of the active layer; and
forming the light blocking layer on the insulating layer so as to cover at least the channel area of the active layer.

12. The method as claimed in claim 10, further comprising:
forming a gate insulating layer on the substrate to cover the gate electrode;
forming the active layer on the gate insulating layer;
forming the insulating layer covering at least a channel area of the active layer;
forming the source and drain electrodes on the insulating layer to contact the active layer;
forming a passivation layer to cover the gate insulating layer, the source and drain electrodes, and the insulating layer; and
forming the light blocking layer on the passivation layer so as to cover at least the channel area of the active layer.

13. The method as claimed in claim 10, wherein the light blocking layer blocks blue light.

14. The method as claimed in claim 10, wherein the light blocking layer is disposed on a path of light that is emitted from the organic light emitting device, which path is incident to the channel area.

15. The method as claimed in claim 10, wherein at least a portion of light emitted from the organic light device is reflected by the light blocking layer.

16. The method as claimed in claim 10, wherein light emitted from the organic light emitting device is emitted toward the substrate.

17. The method as claimed in claim 10, wherein the active layer includes an oxide semiconductor.

* * * * *